United States Patent [19]
Young et al.

[11] Patent Number: 6,040,707
[45] Date of Patent: Mar. 21, 2000

[54] CONSTANT SLEW RATE AMPLIFIER

[75] Inventors: William R. Young, Palm Bay, Fla.;
William B. Shearon, Findlay, Ohio

[73] Assignee: Intersil Corporation, Palm Bay, Fla.

[21] Appl. No.: 08/929,734

[22] Filed: Sep. 15, 1997

[51] Int. Cl.$^7$ .................................................. H03K 17/16
[52] U.S. Cl. ................................ 326/21; 326/86; 326/33; 326/81; 327/111
[58] Field of Search .................................. 326/21, 33, 83, 326/86, 80, 81; 327/111, 108, 170, 392, 399

[56] References Cited

U.S. PATENT DOCUMENTS

| | | | |
|---|---|---|---|
| 4,567,378 | 1/1986 | Raver | 326/83 |
| 4,972,101 | 11/1990 | Partovi et al. | 323/83 |
| 5,283,631 | 2/1994 | Koerner et al. | |
| 5,382,838 | 1/1995 | Sasaki et al. | 327/108 |
| 5,489,862 | 2/1996 | Risinger et al. | 327/108 |
| 5,598,119 | 1/1997 | Thayer et al. | 326/83 |
| 5,623,216 | 4/1997 | Penza et al. | 326/121 |
| 5,633,600 | 5/1997 | Ohnishi | 326/83 |
| 5,854,797 | 12/1998 | Schwartz et al. | 371/22.1 |

FOREIGN PATENT DOCUMENTS

| | | |
|---|---|---|
| 0422391 A2 | 9/1990 | European Pat. Off. . |
| 0422391 A3 | 9/1990 | European Pat. Off. . |
| 0492506 A2 | 12/1991 | European Pat. Off. . |
| 0492506 A3 | 12/1991 | European Pat. Off. . |

*Primary Examiner*—Jon Santamauro
*Assistant Examiner*—Don Pau Le
*Attorney, Agent, or Firm*—Charles E. Wands

[57] ABSTRACT

A constant slew rate amplifier has a precision internal slew rate control reference, that generates respective positive-going and negative-going voltages, associated with corresponding excursions in the input signal. These slew rate-defining voltages are decoupled from the line, making it possible to drive the line with an amplified output signal that faithfully follows the input signal and conforms with pre-scribed slew rate and rise/fall time specifications, irrespective of the capacitance of the line. In addition, the constant slew rate amplifier of the present invention is configured to minimize power dissipation during non-transitional signal conditions, while providing substantial current to rapidly drive the line from one state to another in accordance with the input signal.

41 Claims, 5 Drawing Sheets

CONSTANT SLEW RATE AMPLIFIER

FIELD OF THE INVENTION

The present invention relates in general to communication circuits, and is particularly directed to a new and improved constant slew rate amplifier for driving a load, such as a digital communication line, in accordance with data transitions in a relatively low voltage input signal, so that the amplified output signal driving the line conforms with prescribed slew rate and rise/fall time specifications, irrespective of the capacitance of the line. In addition, the constant slew rate amplifier of the present invention is configured to minimize power dissipation during non-transient signal conditions, while providing substantial current to rapidly drive the line from one state to another during signal transitions.

BACKGROUND OF THE INVENTION

Suppliers of digital communication circuits, such as those for transmitting digital data, including, but not limited to an RS-232 formatted digital data stream, must conform with user specifications that define maximum and minimum limits on slew rate, as well a rise and fall time boundaries of respective signal transitions in the transmitted data. Unfortunately, the characteristics (especially capacitance) of the loads (lines) to which such digital data transmission equipment may be connected can be expected to vary from line to line, so that the performance of the equipment is potentially susceptible to the unknown variations in the properties of the line.

Figure 1:
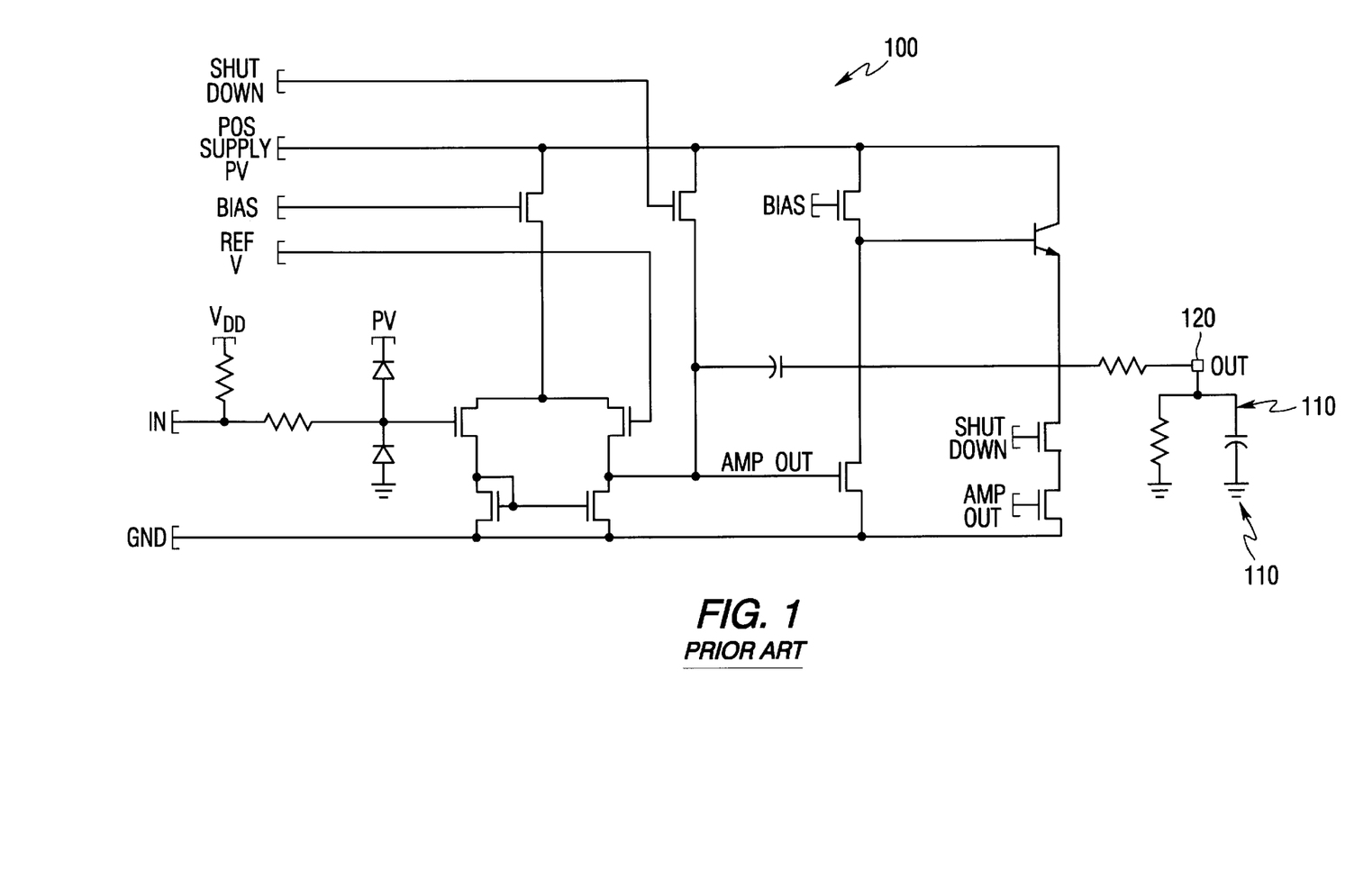
FIG. 1 schematically illustrates a conventional line driver circuit for driving a variable capacitance load.

The conventional practice to handle these variations has been to drive the line hard by means of a high gain amplifier, such as the high gain operational amplifier schematically illustrated at 100 in FIG. 1, and hope that the capacitance of the line (which typically may fall anywhere between 50 and 2500 picofarads) will not significantly distort the output signal (take the circuit's performance outside of spec.). The fundamental problem with this approach is the fact that the load, illustrated as a parallel RC circuit 110 coupled between the amplifier output node 120 and ground, effectively becomes part of the circuit and thereby affects the time constant properties (slew rate and rise/fall times) of the amplified driving signal. In order to ensure that ample current gain is provided to the driven signal, a substantial bias current is continuously applied to the amplifier, resulting in unwanted power dissipation in the circuit at (steady state) times other than during signal transient conditions.

SUMMARY OF THE INVENTION

In accordance with the present invention, the shortcomings of such a conventional digital line driver, described above, are effectively obviated by a constant slew rate amplifier having a precision internal slew rate control reference, for positive-going or negative-going signal excursions. Advantageously, the slew rate control reference is decoupled from the line, making it possible to drive the line with an amplified output signal that faithfully tracks the input signal and conforms with prescribed slew rate and rise/fall time specifications, irrespective of the capacitance of the line. In addition, the constant slew rate amplifier of the present invention is configured to minimize power dissipation during non-transitional signal conditions, while providing substantial current to rapidly drive the line from one state to another in accordance with the input signal.

For this purpose, the constant slew rate amplifier of the invention includes a voltage level shift and bias supply circuit, to which a low voltage logic input signal, that is to be slewed to a high voltage output signal for driving a variable capacitance line, such as that for transporting RS-232 formatted digital communication signals, referenced above, is supplied. The voltage level shift and bias supply circuit comprises a series arrangement of voltage level converters that generate various complementary voltages for controlling the operation of each of a pair of slew rate reference signal generators.

As a non-limiting example, each slew rate reference signal generator may generate the slew rate reference signal as a signal (e.g., voltage) that changes monotonically with time. Such a monotonically varying signal may comprise a continuously or stepwise increasing or decreasing ramp voltage. In the illustrated embodiments of the invention, to be described in detail below, the slew rate reference signal generator is described as comprising precision positive and negative voltage ramp generators, respectively associated with positive-going and negative-going signal excursions. The functionality of each ramp generator is substantially the same—that of providing a well defined (positive or negative) ramp voltage, that eventually transitions to one of a positive supply voltage or a negative supply voltage, to which the output line is to be driven, in accordance with intended slew rate.

Where the semiconductor manufacturing processing sequence provides for the formation of fully complementary polarity (CMOS, PNP/NPN) devices in the same integrated circuit wafer, the circuit configuration of each ramp voltage control section may be essentially the same (save complementary biasing for opposite polarity type devices). In the detailed description below, respective embodiments of the invention are set forth for case where a BiCMOS processing sequence does not provide for fully complementary circuit devices, in particular, PNP bipolar devices for the negative ramp voltage control section to complement NPN devices of the positive ramp voltage control section of a BiCMOS-configured integrated circuit architecture.

In the first embodiment, the positive ramp voltage control section is an open-loop circuit, comprising a constant current source, that controllably supplies a constant charging current to a capacitor, producing a linear positive voltage ramp. This positive ramp is coupled to a Darlington-connected source/emitter follower circuit, which operates as a voltage-controlled voltage source and is operative to apply a linear ramp to the output node that follows the internally generated voltage ramp. The ramp voltage is also applied to a threshold detector, the output of which is coupled to a by-pass MOSFET switch for the Darlington follower circuit. In response to the ramp reaching a prescribed threshold, the by-pass switch is rendered conductive, causing the output node to be immediately pulled up to the positive supply rail voltage. In this positive voltage level state of the output node, only minimal power is dissipated in the Darlington follower circuit; also, since the threshold detector comprises a CMOS inverter pair, it has no power dissipation in the steady state condition. In this steady state condition of the amplifier, any potential current flow path between the power supply rails will encounter an active device that has been placed in a high impedance state, resulting in minimal power dissipation within the amplifier.

The negative ramp voltage control section is comprised of a MOSFET-configured constant current source having its source-drain path coupled between the negative supply rail and a negative ramp voltage line. The constant current source is controllably operative to supply a constant charging current to a capacitor, so that a negative ramp voltage may be produced on a negative ramp voltage line. The negative ramp voltage line is coupled to a negative voltage threshold detector, the output of which is coupled to an output driver by-pass switch, and to the non-inverting input of an operational amplifier. The voltage at the output node is sensed via a feedback line and applied to the inverting input of the operational amplifier. The voltage at the amplifier's output causes the output of the line driver to track that of the negative going ramp, with substantial current gain. When the negative ramp voltage reaches a threshold voltage, the by-pass switch is rendered conductive, so as to rapidly pull the output node all the way to the negative supply voltage.

In order to avoid the unnecessary dissipation of power in the closed loop operational amplifier-based negative ramp control section of the first embodiment, as a result of continually applied bias current during the steady state, a second embodiment is configured to interrupt unnecessary bias current flow to the operational amplifier during steady state, yet substantial bias current is provided during transient operation. In the second embodiment, the open-loop driven positive ramp voltage control section is substantially the same as that of the first embodiment.

However, the closed loop operational amplifier-based negative ramp control section is modified such that the output of the negative voltage threshold detector is coupled to control inputs of MOSFETs installed between the negative supply rail and source-drain paths of load MOSFETs of the operational amplifier. Also, the source-drain paths of the operational amplifier's MOSFETs are coupled in series with a pair of bias current supply MOSFETs, one of which supplies a fixed bias current, while the other supplies a bias current dependent upon the ramp voltage.

In operation, during a negative-going voltage transition of the input signal, as the capacitor charges, when the linearly decreasing voltage reaches a prescribed voltage, the output of the threshold detector changes state, turning off the MOSFET switches and decoupling the negative supply rail bias voltage from the operational amplifier. This allows the voltage on the amplifier's output line to be pulled up near the positive supply voltage, turning on the output line driver hard, and pulling the output node down to the negative supply rail. In addition, this decoupling of the negative supply rail from the operational amplifier effectively prevents power dissipation in the amplifier, when the amplifier is in an inactive (non-transient) state.

DETAILED DESCRIPTION

As described briefly above, the constant slew rate amplifier of the present invention employs a pair of precision internal slew rate control references, one for each of positive-going and negative-going signal excursions.

Because each slew rate control reference is decoupled from the driven output line, the line is driven with an amplified output signal that faithfully tracks the input signal and conforms with prescribed slew rate and rise/fall time specifications, irrespective of line capacitance. Moreover, the amplifier minimizes power dissipation during non-transitional signal conditions, yet provides substantial current to rapidly drive the line between states.

Figure 2:
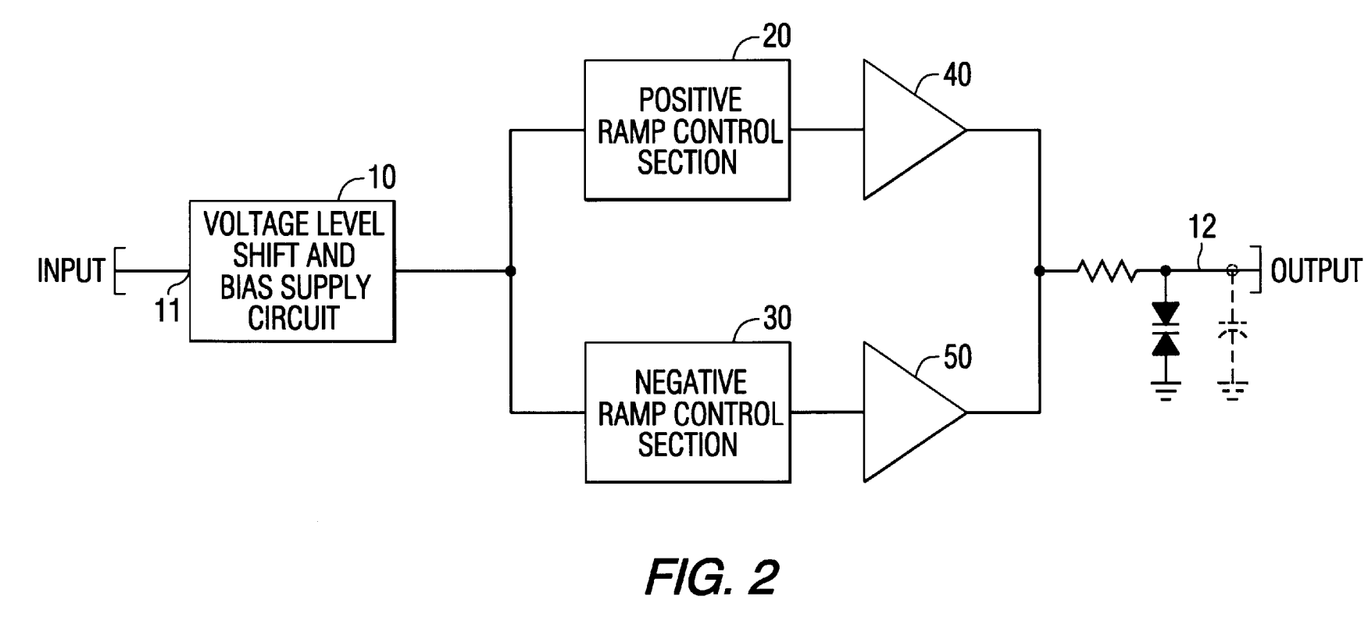
FIG. 2 is a block diagram illustration of the constant slew rate amplifier of the invention.

For this purpose, as diagrammatically illustrated in FIG. 2, the constant slew rate amplifier of the invention includes a voltage level shift and bias supply circuit 10, having an input port 11 coupled to receive a low voltage logic input signal (INPUT). The input signal is to be slewed to a high voltage output signal (OUTPUT) which drives a variable capacitance line 12, such as that for transporting RS-232 formatted digital communication signals. The voltage level shift and bias supply circuit 10 comprises a series arrangement of voltage level converters, to be described with reference to FIG. 3.

These voltage level converters are operative to generate various complementary voltages for controlling the operation of each of a pair of slew rate reference signal generators. Each slew rate reference signal generator may generate the slew rate reference signal as a signal (e.g., voltage) that changes monotonically with time. Such a monotonically varying signal may comprise a continuously or stepwise increasing or decreasing ramp voltage.

In the illustrated embodiments of the invention, to be described in detail below with reference to FIGS. 4 and 5, the slew rate reference signal generators comprise precision positive and negative-going voltage generators, shown in FIG. 2 as a positive ramp control section 20 and a negative ramp control section 30, that are respectively associated with positive-going and negative-going signal excursions. As will be described in detail with reference to FIGS. 4 and 5, each ramp voltage control section 20/30 is operative to generate a well defined monotonically changing voltage. As a non-limiting example, the monotonically changing voltage may be a ramp voltage, that varies linearly or non-linearly with time.

The output line is initially driven in accordance with this changing voltage in response to a transition in the input signal.

The outputs of the ramp voltage control sections 20/30 are amplified in gain stages 40/50 and then applied to output line 12. The output line 12 continues to follow the ramp, until the internally generated ramp reaches a prescribed threshold associated with the desired slew rate. In response to the ramp voltage reaching this threshold, switching circuitry coupled with a respective gain stage 40/50 is triggered, causing the output line 12 to be immediately pulled up to the positive supply voltage or down to the negative supply voltage, in accordance with the level transition of the input signal INPUT.

Figure 3:
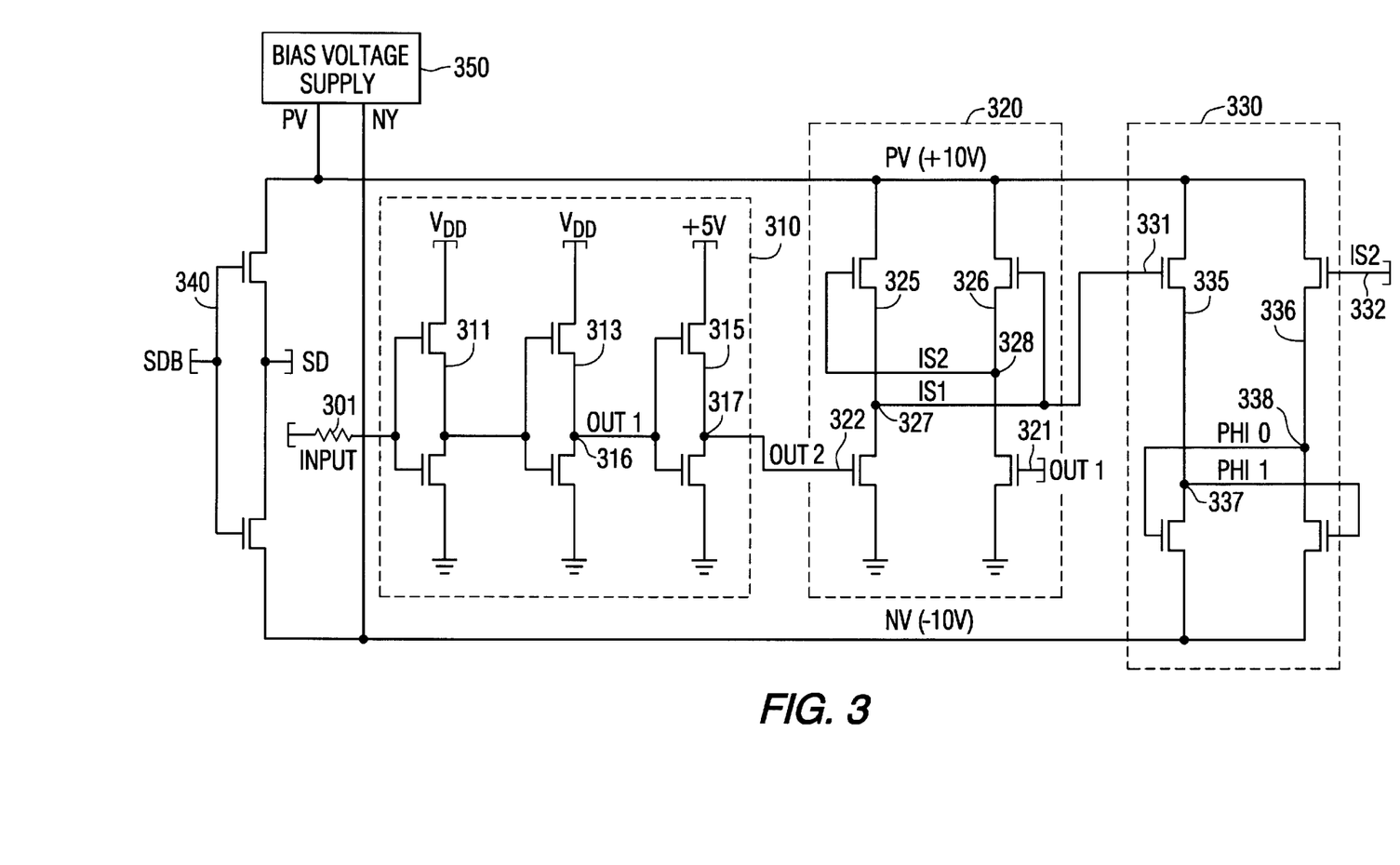
FIG. 3 schematically illustrates the circuit configuration of the voltage level shift and bias supply circuit of FIG. 2.

Referring now to FIG. 3, the voltage level shift and bias supply circuit 10 of FIG. 2 is schematically illustrated as comprising an input port 301, to which a low voltage logic input signal INPUT, that is to be slewed to a high voltage output signal for driving a variable capacitance line, such as for transporting RS-232 formatted digital communication signals, is coupled. The input port 301 is coupled to a series arrangement of voltage level converters 310-320-330 that produce various complementary voltages for controlling the operation of each of an open loop-driven positive ramp control section and a feedback loop-driven negative ramp control section of a constant slew rate amplifier to be described below with reference to FIG. 4.

The first voltage level converter 310 contains cascaded CMOSFET inverters 311, 313 and 315, which are connected between positive and negative supply voltages VDD (e.g., +5V) and ground, and function to shift the voltage variation range of the input signal to a first intermediate voltage range (e.g., 0–5V). The output node 316 of inverter 313, denoted as OUT1, and the output node 317 of inverter 315, denoted as OUT2, are coupled to respective input nodes 321 and 322 of the second voltage level converter 320, which is comprised of a pair of cross-coupled CMOSFET inverters 325 and 326. Inverters 325 and 326 are powered from a positive supply rail PV and are operative to provide a second level shift from the first prescribed range (0–5V) to a second intermediate range (e.g., 0–10V). Positive supply voltage PV and a negative supply voltage NV are provided by a bias voltage generator unit 350.

The output node 327 of inverter 325, denoted as IS1, and the output node 328 of inverter 326, denoted as IS2, are coupled to respective input nodes 331 and 332 of the third voltage level converter 330, that includes a further pair of cross-coupled CMOSFET inverters 335 and 336, which are powered by respective positive and negative supply rails PV and NV, respectively, and are operative to provide a third level shift from the second prescribed range (0–10V) to a full complementary level output voltage range (e.g., –10V to +10V) for controlling the operation of driver circuits that drive the output line.

The output node 337 of inverter 335, denoted as PHI1, and the output node 338 of inverter 336, denoted as PHI0, are coupled to various nodes of the constant slew rate amplifier of FIG. 4, as will be described. Also shown in FIG. 3 is a CMOSFET inverter 340, which is coupled between positive and negative supply rails PV and NV, with a shutdown signal SDB applied thereto and being operative to supply a shutdown signal SD, which forces the output of the slew rate amplifier of FIG. 4 into a high impedance mode.

As will be described, the constant slew rate amplifier of the present invention comprises an open loop-driven positive ramp voltage control section and a feedback loop-driven negative ramp voltage control section. The functionality of each ramp voltage control section is substantially the same—that of providing a well defined (positive or negative) ramp voltage, that transitions to one of a positive voltage PV or a negative voltage NV, to which the output line is to be driven, in accordance with a respective logic level transition of the input signal applied to the input port of the voltage level shift and bias supply circuit 10 of FIG. 2, described above.

Where the semiconductor manufacturing processing sequence provides for the formation of fully complementary polarity (CMOS, PNP/NPN) devices in the same integrated circuit wafer, the circuit configuration of each ramp voltage control section may be essentially the same (save complementary biasing for opposite conductivity type devices). However, where such processing steps do not provide for the formation of such fully complementary device structures, the circuit configurations of the two ramp voltage control sections will necessarily differ. The embodiment to be described in detail is for the case where a BiCMOS processing sequence does not provide for fully complementary circuit devices, in particular, PNP bipolar devices for the negative ramp voltage control section to complement NPN devices of the positive ramp voltage control section of a BiCMOS-configured integrated circuit architecture.

Figure 4:
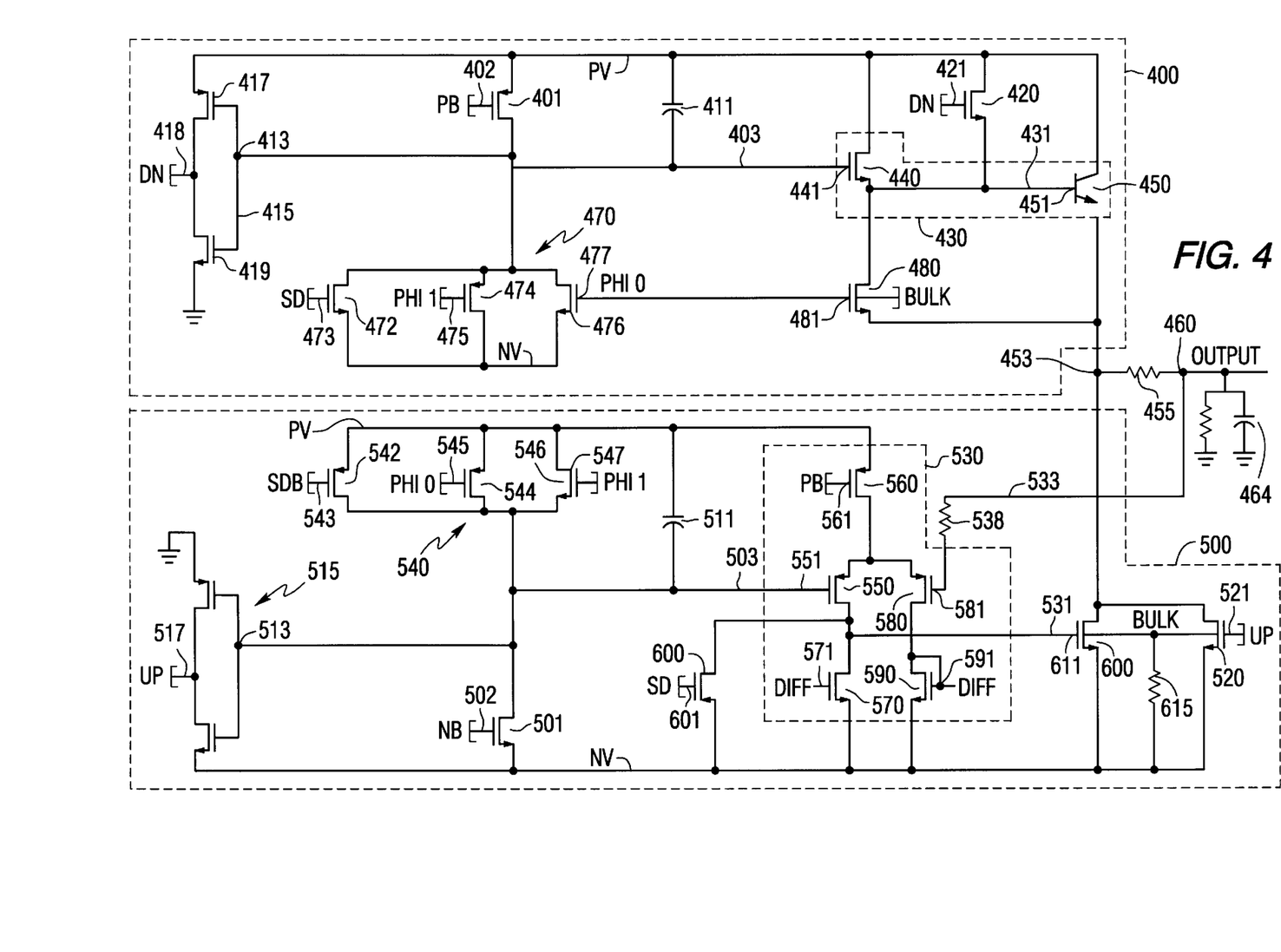
FIG. 4 schematically illustrates a first embodiment of slew rate control and output driver components of the constant slew rate amplifier diagram of FIG. 2.

Referring now to FIG. 4, a first embodiment of the open-loop driven positive ramp voltage control section is shown at 400 as comprising a P-MOSFET-configured constant current source 401 having its source-drain path coupled between the positive supply rail PV and a positive ramp voltage line 403. The control (gate) electrode 402 of P-MOSFET current source 401 is coupled to a prescribed gate bias voltage PB, supplied from the bias voltage generator unit 350, so that P-MOSFET 401 is controllably operative to supply a constant charging current to a capacitor 411, whereby a linear voltage ramp from the negative supply rail NV toward the positive supply rail PV may be provided on the positive ramp voltage line 403.

The positive ramp voltage line 403 is coupled to an input (inverter gate) node 413 of a threshold detector 415, comprised of CMOSFET inverter pair 417 and 419, coupled between the positive supply rail PV and a reference voltage terminal (e.g., ground). Threshold detector 415 monitors the voltage level on ramp voltage line 403, and its output node 418 changes state when the voltage on line 403 resulting from the linear charging of capacitor 411 reaches a prescribed value. This change in state of the output node 418 of threshold detector 415 is used to immediately hard-drive a node 453 to the positive supply voltage PV, as will be described. In an alternative configuration, rather than monitor the voltage on line 403, the threshold detector 415 may be connected to monitor the voltage at an amplifier output node 460, as shown by dotted line connection 465.

The output node 418 of CMOSFET inverter pair 417 and 419, denoted as DN, is coupled to a control (gate) input 421 of a P-MOSFET 420. The source-drain path of P-MOSFET 420 is coupled between the positive supply rail PV and to a line 431 of a high current gain-providing, Darlington-connected BiMOS follower transistor pair 430. As will be described, Darlington-connected BiMOS follower transistor pair 430 includes a source-follower N-MOSFET 440 and an NPN emitter-follower 450, that function as a ramp-controlled voltage-controlled voltage source for node 453.

The positive ramp voltage line 403 is coupled to input (gate) node 441 of the source-follower N-MOSFET 440 of Darlington circuit 430. The source-drain path of source-follower N-MOSFET 440 is coupled between positive supply rail PV and line 431. The emitter-follower NPN transistor 450 has its base 451 coupled to line 431 and its collector-emitter path coupled between positive supply rail PV and node 453, which is coupled through a resistor 455 to an output node 460. Output node 460 is coupled to a driven load (line impedance), shown as a resistor-capacitor circuit 464, that is coupled between node 460 and ground.

MOSFET switches 472, 474 and 476 of a controlled clamp circuit 470 have their source-drain paths coupled between the positive voltage ramp line 403 and the negative supply rail NV. The gate 473 of N-MOSFET switch 472 is coupled to receive the shutdown signal SD supplied by the voltage level shift and bias supply circuit 10. The gate 475 of P-MOSFET 474 is coupled to receive the voltage PHI1 produced by circuit 10, while the gate 477 of N-MOSFET 476 is coupled to receive the voltage PHI0 produced by circuit 10.

If any of MOSFETs 472, 474 and 476 is turned ON, capacitor 411 is discharged therethrough and the voltage on the positive ramp voltage line 403 is clamped at the negative supply rail voltage NV. If each of MOSFETs 472, 474 and 476 is turned OFF, however, capacitor 411 will be charged by constant current source P-MOSFET 401, and positive voltage ramp line 403 will follow a linear positive voltage ramp from the negative supply voltage NV toward the positive supply rail PV. An N-MOSFET 480 has its source-drain path coupled between line 431 and node 453, and its gate 481 coupled to receive the voltage PHI0 from the voltage level shift and bias supply circuit 10; it also receives a bulk bias voltage BULK. N-MOSFET 480 serves to drain off stray charge on the base node of NPN emitter-follower transistor 450.

In operation, during a positive-going voltage transition of the input signal INPUT applied to input port 301, with the shutdown signal SD disabled, low, the voltages PHI-1 and PHI-0 produced by voltage level shift and bias supply circuit 10 turn off the MOSFET switches 472, 474 and 476. Since each of these MOSFETs is turned-off, the constant current source P-MOSFET 401 is allowed to charge the capacitor 411 (linearly with time) via positive voltage ramp line 403. As the capacitor 411 charges, the voltage on voltage ramp line 403 increases linearly with time from the negative rail value NV toward the positive rail voltage PV. (As a non-limiting example, the parameters of the circuit components of the open-loop driven positive ramp voltage control section may be chosen so as to provide a voltage ramp rate on the order of twenty volts per microsecond.)

This steadily increasing voltage ramp is applied to the gate node 441 of the N-MOSFET 440 of the Darlington-connected BiMOS follower transistor pair 430, so that the voltage at node 453 at the emitter of NPN transistor 450 follows the positive-going voltage ramp on line 403 and with a substantial output drive current. Thus, the Darlington circuit 430 operates as a voltage-controlled voltage source for node 453. As the voltage on ramp voltage line 403 linearly increases towards the positive supply voltage PV it eventually reaches the threshold voltage of positive voltage threshold detector 415 associated with the desired slew rate, as described above. (Similarly, in the alternative voltage-monitoring configuration shown by dotted line 465, the voltage at output node 460 will eventually reach a prescribed threshold of the detector 415.)

When this happens, the output DN of threshold detector 415 changes state (goes low), thereby turning on the P-MOSFET 420. Since the source-drain path of the P-MOSFET 420 is coupled between the positive supply rail PV and line 431 of the Darlington follower circuit 430, line 431 and therefore the base of emitter-follower NPN transistor 450 is pulled up to the supply rail PV, thereby maintaining the drive to NPN transistor 450, and effectively driving node 453 to (within a diode voltage of) the positive supply voltage PV. Moreover, the source-follower N-MOSFET 440 is now effectively shorted to the positive supply rail PV. Thus, in the positive voltage level state of node 453, only minimal power is dissipated in the Darlington follower circuit 430. No power is dissipated if the external load is disconnected. Similarly, since threshold detector 415 comprises a CMOS inverter pair, it has no power dissipation in the steady state mode. Thus, during steady state mode, any current path through an active device in circuit with a power supply rail will encounter that active device having been placed in a high impedance state, resulting in minimal power dissipation within the amplifier.

It should also be noted that since the N-MOSFET 440 is a source-follower, it turns off as the voltage on line 431 approaches $V_{TN}$ of gate node 441; therefore, line 431 cannot be pulled higher than PV-$V_{TN}$ by the source-follower N-MOSFET 440. The P-MOSFET 420 provides a path to pull the base of NPN emitter-follower transistor 450 to PV.

As pointed out above, where the manufacturing sequence through which each of the positive and negative ramp voltage control sections are formed allows the formation of fully complementary polarity (CMOS, PNP/NPN) devices in the same integrated circuit wafer, the circuit configuration of the negative ramp voltage control section, which provides a negative-going ramp voltage that is effectively a mirror-image of the positive voltage ramp, may be essentially the same as that of the positive ramp control voltage section 400, described above, except for complementary biasing for opposite conductivity type devices.

However, where the processing sequence does not provide for the formation of such fully complementary device structures, for example, where the manufacturing process does not provide for the formation of a PNP bipolar device for a Darlington emitter follower circuit (complementary to the Darlington follower pair 430, described above), the circuit configuration of the negative ramp voltage control section will differ from that of the positive ramp voltage section 400. To accommodate this difference, the negative ramp control section of the dual polarity ramp generator of the present invention, rather than being open loop, is a feedback loop-driven negative ramp voltage control section, a first embodiment of which is shown at 500 in FIG. 4.

More particularly, in a complementary fashion to the open-loop driven positive ramp control section 400, the negative ramp voltage control section is comprised of an N-MOSFET-configured constant current source 501 having its source-drain path coupled between the negative supply rail NV and a negative ramp voltage line 503. The control input (gate) 502 of constant current source N-MOSFET 501 is coupled to receive a prescribed gate bias voltage NB from bias voltage generator 350, and is controllably operative to supply a constant charging current to a capacitor 511, so that a negative ramp voltage may be produced on the negative ramp voltage line 503.

The negative ramp voltage line 503 is coupled to an input (inverter gate) node 513 of a negative voltage threshold detector 515, comprised of a CMOSFET inverter coupled between the supply rails ground and NV, respectively. As in the positive ramp control section 400, rather than monitor the voltage on line 503, the threshold detector 515 of the negative ramp control section 500 may be connected to monitor the voltage at amplifier output node 460, as shown by dotted line connection 565.

The output node 517 of the CMOSFET inverter threshold detector 515, denoted as UP, is coupled to a control (gate) input 521 of an N-MOSFET switch 520, the source-drain path of which is coupled between negative supply rail NV and node 453. As will be described, negative threshold detector 515 and associated N-MOSFET switch 520 operate in a manner similar to that of threshold detector 415 and P-MOSFET switch 420 of the positive ramp voltage control section 400; namely, it functions to rapidly pull node 453 all the way to the negative supply voltage NV, when the negative ramp voltage on line 503 reaches the threshold voltage of the threshold detector 515.

MOSFET switches 542, 544 and 546 of a controlled clamp circuit 540 have their source-drain paths coupled between negative voltage ramp line 503 and the positive supply rail PV. The gate 543 of P-MOSFET switch 542 is coupled to receive the shutdown signal SDB; the gates 545 and 547 of MOSFET switches 544 and 546, respectively are coupled to receive the voltage PHI0 and PHI1 produced by the voltage level shift and bias supply circuit 10, described above. If any of the MOSFETs 542, 544 and 546 is turned ON, the voltage on the negative ramp voltage line 503 is clamped at that of the positive supply rail PV, and capacitor 511 is discharged. If each of the MOSFETs 542, 544 and 546 is turned off, however, the voltage on line 503 is now allowed to follow a linear negative-going voltage ramp from the positive rail voltage PV at the drain of constant current source N-MOSFET 501 toward the negative supply rail NV, associated with the charging of capacitor 511 by constant current source N-MOSFET 501.

The negative ramp voltage line 503 is further coupled to a non-inverting input (gate) node 551 of a P-MOSFET 550 of an operational amplifier 530, which is formed of MOSFET pairs 550/580 and 570/590. The source-drain path of P-MOSFET 550 is coupled in series with the drain-source path of load N-MOSFET 570. A feedback line 533 is coupled through a resistor 538 from output node 460 to an inverting input of the operational amplifier—the gate 581 of a P-MOSFET 580. P-MOSFET 580 has its source-drain path coupled in series with the drain-source path of load N-MOSFET 590. The sources of P-MOSFET pair 550/580 are connected to the drain of a bias P-MOSFET 560, the gate 561 of which is coupled to receive the positive bias voltage PB. The respective gates 571 and 591 of load N-MOSFETs 570 and 590 are coupled to the drain of N-MOSFET 590.

A controlled turn-off N-MOSFET switch 600 is coupled between the negative supply rail NV and an amplifier output line 531. The gate 601 of N-MOSFET 600 is coupled to receive the shutdown signal SD. N-MOSFET 600 is controlled by the shutdown signal SD produced by the voltage level shift and bias supply circuit 10, to controllably disable the operational amplifier 530 and turn off an output driver N-MOSFET 610. The operational amplifier's output line 531 is further coupled to the gate 611 of the output node driver N-MOSFET 610, the source-drain path of which is coupled between negative supply rail NV and node 453. A resistor 615 is coupled to the negative supply rail and provides the MOSFET bulk bias voltage BULK to the N-MOSFETs 480, 520 and 610.

In operation, during a negative-going voltage transition of the input signal IN applied to input port 301, the voltages PHI0 and PHI1 produced by voltage level shift and bias supply circuit 10 turn off MOSFETs 544 and 546, thereby allowing the constant current source N-MOSFET 501 to charge capacitor 511 linearly with time from its initial value of PV towards the negative supply rail voltage NV. As capacitor 511 charges, the steadily decreasing voltage ramp on voltage ramp line 503 is applied to the non-inverting input node 551 of the operational amplifier 530. At the same time, the voltage at the output node 460, which is sensed via feedback line 533, is applied to the inverting input gate 581 of the P-MOSFET 580 of the operational amplifier 530, as described above. As a result, the voltage on output line 531 causes the driven output of driver N-MOSFET 610 to track that of the negative going ramp, with substantial current gain.

Similar to the operation of the positive ramp voltage generator, the voltage on ramp voltage line 503 linearly increases towards the negative supply voltage NV and eventually reaches the threshold voltage of negative voltage threshold detector 515, as described above. When the negative voltage threshold detector 515 detects its threshold voltage on line 503, its output UP changes state (go high), thereby turning on N-MOSFET 520. Again, as in the alternative voltage monitoring option of the positive ramp control section 400, described above, the threshold detector 515 may detect when voltage at output node 460 eventually reaches a prescribed threshold. In either mode, when the output UP changes state and turns on N-MOSFET 520, an additional driver is placed in parallel with the output driver N-MOSFET 610, so as to rapidly pull node 453 all the way down to the negative supply voltage NV, as desired.

Now although, in the embodiment of the constant slew rate amplifier of the present invention shown in FIG. 4, each of ramp voltage control sections 400 and 500 provides a well defined (positive or negative) ramp voltage, that rapidly transitions to one of a positive voltage PV or a negative voltage NV, to which the output line is to be driven, as described above, the closed loop operational amplifier-based negative ramp control section 500 undesirably dissipates power, as a result of continually applied bias current during the steady state condition. This undesired characteristic is successfully obviated in accordance with a second embodiment of the present invention, schematically illustrated in FIG. 5, wherein unnecessary bias current flow to the operational amplifier during steady state is interrupted, yet substantial bias current is provided during transient operation.

Figure 5:
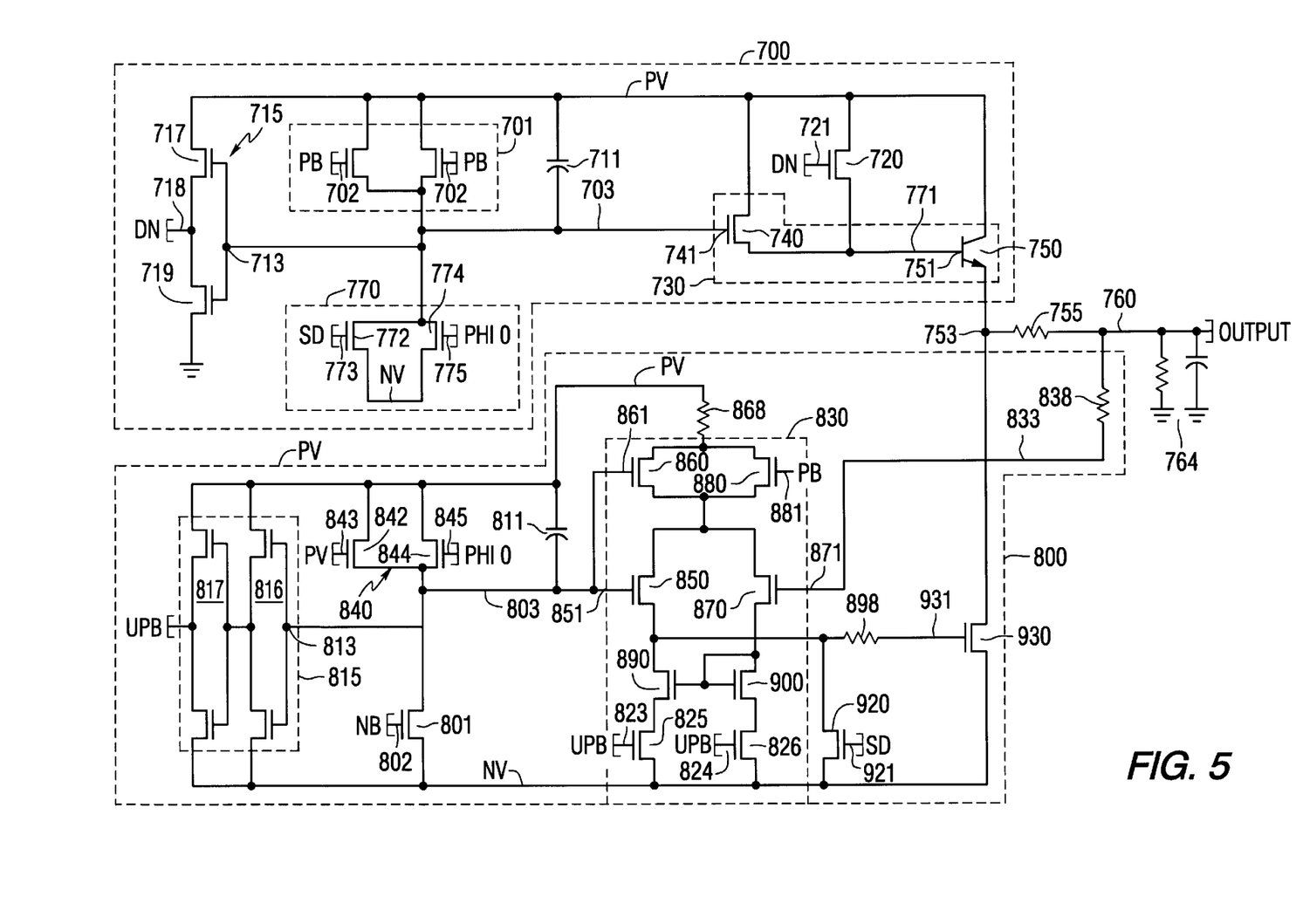
FIG. 5 schematically illustrates a second embodiment of slew rate control and output driver components of the constant slew rate amplifier diagram of FIG. 2.

More particularly, in the second embodiment of the invention shown in FIG. 5, an open-loop driven positive ramp voltage control section 700 is similar to that of the first embodiment shown in FIG. 4, comprising a P-MOSFET-configured constant current source 701, having its source-drain path coupled between the positive supply rail PV and a positive ramp voltage line 703. As in the first embodiment, the control (gate) electrode 702 of the constant current source P-MOSFET 701 is coupled to receive the bias voltage PB from the bias voltage generator unit 350. The constant current source P-MOSFET 701 is controllably operative to supply a constant charging current to a capacitor 711, so that a linear voltage ramp (from the negative supply rail NV toward the positive supply rail PV) may be applied to the positive ramp voltage line 703.

The positive ramp voltage line 703 is coupled to an input node 713 of a threshold detector 715, comprised of CMOSFET inverter pair 717 and 719, that are coupled between the positive supply rail PV and a reference voltage terminal (e.g., ground). The positive ramp threshold detector 715 again monitors the voltage level on ramp voltage line 703, and its output node 718 changes state, in response to the ramp voltage on line 703 reaching a prescribed voltage. As in the first embodiment, threshold detector 715 may alternatively monitor the voltage at an output node 760, as denoted by broken line connection 765. Output node 760 is coupled to a driven load (line impedance), shown as a resistor-capacitor circuit 764, coupled between node 760 and ground. The change in state of the output node 718 of threshold detecting inverter 715 is used to immediately hard-drive node 753 to the positive supply voltage PV, as in the first embodiment.

The output voltage DN at node 718 of threshold detecting inverter 715 is coupled to a control (gate) input 721 of a P-MOSFET switch 720. The source-drain path of P-MOSFET switch 720 is coupled between the positive supply rail PV and to a line 771 of a high current gain-providing, Darlington-connected BiMOS follower transistor pair 730. As in the first embodiment, the Darlington-connected BiMOS follower transistor pair 730 includes a source-follower N-MOSFET 740 and an NPN emitter-follower 750, to provide a ramp-controlled voltage-controlled voltage source for node 753.

The positive ramp voltage line 703 is coupled to input (gate) node 741 of the source-follower N-MOSFET 740 of Darlington circuit 730. The source-drain path of source-follower N-MOSFET 740 is coupled between positive supply rail PV and line 771. The emitter-follower NPN transistor 750 has its base 751 coupled to line 771 and its collector-emitter path coupled between positive supply rail PV and node 753, which is coupled through a resistor 755 to output node 760.

N-MOSFET switches 772 and 774 of a controlled clamp circuit 770 have their source-drain paths coupled between the positive voltage ramp line 703 and the negative supply rail NV. The gate 773 of N-MOSFET switch 772 is coupled to receive the shutdown signal SD supplied by the voltage level shift and bias supply circuit 10. The gate 775 of N-MOSFET 774 is coupled to receive the voltage PHI0 produced by circuit 10. If either of N-MOSFETs 772 and 774 is turned ON, capacitor 711 is discharged therethrough and the voltage on the positive ramp voltage line 703 is clamped at the negative supply rail voltage NV. However, if both N-MOSFETs 772 and 774 are turned off, capacitor 711 will be charged by constant current source P-MOSFET 701, and positive voltage ramp line 703 will follow a linear positive voltage ramp from the negative supply voltage NV toward the positive supply rail PV.

The operation of the positive ramp voltage control section of the embodiment of FIG. 5 is substantially the same as that of FIG. 4, described above. Again, during a positive-going voltage transition of the input signal IN applied to input port 301, the voltage PHI0 produced by the voltage level shift and bias supply circuit 10 turn off N-MOSFET 774, so as to allow the constant current source P-MOSFET 701 to charge the capacitor 711 linearly with time from the negative rail value NV toward the positive rail voltage PV. This voltage ramp is applied to the gate node 741 of source-follower N-MOSFET 740 of the Darlington-connected BiMOS follower transistor pair 730, so that the node 753 at the emitter of NPN emitter-follower transistor 750 provides a voltage that follows the positive-going voltage ramp on line 703 with a substantial output drive current.

As the voltage on ramp voltage line 703 (or alternatively that at the output node 760) linearly increases towards the positive supply voltage PV, it eventually reaches the threshold voltage of positive voltage threshold detector 715 associated with the desired slew rate, causing the output voltage DN of threshold detector 715 to change state, and turning on the P-MOSFET 720. As in the first embodiment, since the source-drain path of P-MOSFET 720 is coupled between the positive supply rail PV and line 771 of the Darlington follower circuit 730, the base of NPN transistor 750 is immediately pulled up to the supply rail PV, turning on NPN transistor 750 hard, and driving node 753 to within a diode voltage of the positive supply voltage PV. The source-follower N-MOSFET 740 is now effectively shorted to the positive supply rail PV.

As in the first embodiment, without an external load, in the positive voltage level state of node 753, effectively no power is dissipated in the Darlington follower circuit or CMOSFET inverter threshold detector 715. Likewise, pulling node 753 to the positive supply rail voltage PV again compensates for the slight reduction of the voltage at node 753 relative to that on the ramp voltage line 703, due to the voltage drop associated with the gate threshold voltage Vt of source-follower N-MOSFET 740.

As described briefly above, in accordance with the second embodiment of the invention, the closed loop operational amplifier-based negative ramp control section is modified to prevent unnecessary power dissipation during the steady state condition, yet provides substantial bias current during transient operation. For this purpose, a feedback loop-driven negative ramp control section 800 is comprised of an N-MOSFET-configured constant current source 801 having its source-drain path coupled between the negative supply rail NV and a negative ramp voltage line 803. The control input (gate) 802 of constant current source N-MOSFET 801 is coupled to receive a prescribed gate bias voltage NB from bias voltage generator 350, and supplies a constant charging current to a capacitor 811, so that a negative ramp voltage may be produced on the negative ramp voltage line 803.

The negative ramp voltage line 803 is coupled to an input (inverter gate) node 813 of a negative voltage threshold detector 815. Threshold detector 815 is comprised of cascaded CMOSFET inverters 816 and 817, that are coupled between the positive and negative supply rails PV and NV, respectively. Again, as in the first embodiment, threshold detector 815 may alternatively monitor the voltage at an output node 760, as denoted by broken line connection 865. The output node 818 of CMOSFET inverter 817, denoted as UPB, is coupled to the control (gate) inputs 823, 824 of N-MOSFET switches 825, 826 that are respectively coupled between the negative supply rail NV and the source-drain paths of load N-MOSFETs 890, 900 of an operational amplifier 830.

A shutdown P-MOSFET 842 and a P-MOSFET switch 844 of a controlled clamp circuit 840 have their source-drain paths coupled between negative voltage ramp line 803 and the positive supply rail PV. The gate 843 of the shutdown P-MOSFET 842 is coupled to receive the shutdown signal SDB, while the gate 845 of the P-MOSFET 844 is coupled to receive the voltage PHI0 produced by the voltage level shift and bias supply circuit 10. If either of the P-MOSFETs 842 and 844 is turned ON, the voltage on the negative ramp voltage line 803 is clamped at that of the positive supply rail PV, as capacitor 811 is discharged. On the other hand, if both P-MOSFETs 842 and 844 are turned off, the voltage on the negative ramp voltage line 803 will follow a negative voltage ramp toward the negative supply rail NV, associated with the charging of capacitor 811 by constant current source 801.

The negative ramp voltage line 803 is further coupled to a non-inverting input (gate) node 851 of a first amplifier P-MOSFET 850 of operational amplifier 830. The source-drain paths of P-MOSFETs 850 and 870 are coupled in series with the source-path of a pair of bias current P-MOSFETs 860 and 880. The gate 861 of bias current P-MOSFET 860 is coupled to the negative ramp voltage line 803, while the gate 881 of bias current P-MOSFET 880 is coupled to receive the bias voltage PB. Bias current P-MOSFET 880 is operative to supply a prescribed fixed bias current, while the bias current supplied by P-MOSFET 860 is controlled as needed, being dependent upon the ramp voltage on line 803.

In an alternative configuration, like P-MOSFET 880, the gate 861 of P-MOSFET 860 may also be coupled to a prescribed bias voltage (as shown in broken lines to bias voltage PB), rather than being coupled to line 851, so that P-MOSFET 860 may also supply a fixed bias current. (P-MOSFET 860 could also be simply left out of the circuit, leaving P-MOSFET 880 as the bias current supply.) The source-drain paths of bias current P-MOSFETs 860 and 880 are coupled through a resistor 868 to the positive supply rail PV.

A feedback line 833, which is coupled through a resistor 838 to output node 860, is further coupled to an inverting input (gate) 871 of a second amplifier P-MOSFET 870 of the operational amplifier 830. The drains of P-MOSFETs 850 and 870 are coupled in series with the drains of respective load N-MOSFETs 890 and 900. The gates of N-MOSFETs 890 and 900 are coupled to the drain of N-MOSFET 900. Respective N-MOSFET switches 825 and 826 have their source-drain paths coupled in series with load N-MOSFETs 890 and 900 and the negative supply voltage rail NV. When turned off by the UPB output voltage, N-MOSFET switches 825 and 826 prevent the flow of bias current and thereby power from being dissipated in the operational amplifier 830.

An operational amplifier output turn-off N-MOSFET 920 has its source-drain path coupled between an amplifier output line 831 and the negative supply rail NV. The N-MOSFET 920 is controlled by the shutdown signal SD applied to its gate 921, to turn off the operational amplifier output driver N-MOSFET 930 in the shutdown mode. The amplifier output line 831 is coupled through a resistor 898 to the gate 931 of output driver MOSFET 930, the source-drain path of which is coupled in series with node 753 and the negative supply rail NV. An N-MOSFET 940 has its source-drain path coupled between amplifier output line 831 and the negative supply rail NV. The N-MOSFET 940 is controlled by the voltage PHI1 applied to its gate 941, to prevent low-level leakage from causing charge accumulation on the high impedance output line 831, when the output node 760 is in its high state.

In operation, during a negative-going voltage transition of the input signal IN applied to input port 301, the voltage PHI0 produced by voltage level shift and bias supply circuit 10 turns off P-MOSFET 844, allowing constant current source 801 to charge capacitor 811 linearly with time via voltage ramp line 803. As capacitor 811 charges, the linearly decreasing voltage on voltage ramp line 803 is applied to the non-inverting input node 851 of the operational amplifier 830. At the same time, the voltage at the output node 760, which is sensed via feedback line 833, is applied to the inverting input gate 871 of the P-MOSFET 870 of the operational amplifier 830. As a result, the voltage on output line 831 causes the driven output of driver N-MOSFET 930 to track that of the negative going ramp, with substantial current gain.

Upon the negative voltage threshold detector 815 detecting that the value of the ramp voltage on ramp line 803 (or at the output node 760) has reached a prescribed voltage, its output UPB changes state (goes low), thereby turning off N-MOSFET switches 825 and 826, and decoupling the negative supply rail bias voltage NV from the operational amplifier 830. This allows the voltage on the output line 831 to be pulled up near PV, turning on driver N-MOSFET 930 hard, thereby pulling the node 753 down to the negative supply rail NV. Moreover, decoupling the negative supply rail NV from operational amplifier 830 effectively prevents power dissipation in the amplifier, when the amplifier 830 is in an inactive (non-transient) state.

As will be appreciated from the foregoing description, the shortcomings of a conventional digital line driver, described above, are effectively obviated by the constant slew rate amplifier of the present invention, which employs a precision internal slew rate control reference, for positive-going or negative-going signal excursions. Advantageously, the slew rate control reference is decoupled from the line, making it possible to drive the line with an amplified output signal that faithfully tracks the input signal and conforms with prescribed slew rate and rise/fall time specifications, irrespective of the capacitance of the line. In addition, the constant slew rate amplifier of the present invention is configured to minimize power dissipation during non-transitional signal conditions, while providing substantial current to rapidly drive the line from one state to another in accordance with the input signal.

While we have shown and described several embodiments in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed:

1. An amplifier for driving a load comprising:
    a slew rate generator which is operative to generate a slew rate reference signal that is independent of said load; and
    a driver circuit, which is operative to drive said load with an output signal in accordance with an input signal and having a slew rate based upon said slew rate reference signal; and wherein
    said slew rate reference signal is a changing voltage, and wherein said driver circuit is operative to drive said load with said output signal that follows said changing voltage and then transitions from said changing voltage to a prescribed output level different from that of said changing voltage.

2. An amplifier according to claim 1, wherein said load comprises a variable capacitance line.

3. An amplifier according to claim 1, wherein said slew rate generator comprises a positive-going voltage generator that is operative to generate a positive-going voltage in response to a first polarity transition of said input signal, and a negative-going voltage generator that is operative to generate a negative-going voltage in response to a second polarity transition of said input signal, and wherein said driver circuit is operative to drive said load with an amplified output signal that follows signal excursions of said input signal in accordance with said positive-going and negative-going voltages.

4. An amplifier according to claim 1, including a bias circuit for supplying a bias current for said amplifier as said driver circuit drives said load with said output signal that follows said changing voltage, and being switched to a steady state that reduces power dissipation in said amplifier in response to said output signal transitioning to said prescribed level, such that during said steady state, any current flow path with a power supply node for said amplifier through an active device encounters said active device being placed in a high impedance state, so as to reduce said power dissipation in said amplifier.

5. An amplifier according to claim 1, wherein said driver circuit is operative to transition said output signal to said prescribed output level, in response to one of said changing voltage and said output signal reaching a threshold.

6. An amplifier according to claim 5, wherein said driver circuit is operative to transition said output signal to said prescribed output level, in response to said changing voltage reaching a threshold.

7. An amplifier according to claim 5, wherein said driver circuit is operative to transition said output signal to said prescribed output level, in response to said output signal reaching a threshold.

8. An amplifier according to claim 1, wherein said driver circuit includes an operational amplifier that generates an output voltage that follows said changing voltage and supplies current gain to said load.

9. A method for driving a load in accordance with an input signal having transitions between first and second input signal levels comprising the steps of:
    (a) generating a changing voltage that is independent of said load; and
    (b) driving said load with an output signal that transitions between first and second output levels at a slew rate based upon said changing voltage, and wherein step (b) comprises causing said output signal to transition from said changing voltage to said one of said first and second output levels at a rate faster than the rate of change of said changing voltage.

10. An amplifier for driving a load in accordance with an input signal that transitions between first and second input signal levels, comprising a voltage generator that controllably generates first and second opposite polarity changing voltages independent of said load, and an output driver, coupled to said voltage generator and being operative to drive said load with an output signal that transitions between first and second output levels at a slew rate based upon said first and second voltages, and wherein said output driver is configured for closed loop operation.

11. An amplifier for driving a load comprising:
a slew rate generator which is operative to generate a slew rate reference signal that is independent of said load; and
a driver circuit, which is operative to drive said load with an output signal in accordance with an input signal and having a slew rate based upon said slew rate reference signal; and wherein
slew rate generator comprises a positive-going voltage generator that is operative to generate a positive-going voltage in response to a first polarity transition of said input signal, and a negative-going voltage generator that is operative to generate a negative-going voltage in response to a second polarity transition of said input signal, and wherein said driver circuit is operative to drive said load with an amplified output signal that follows signal excursions of said input signal in accordance with said positive-going and negative-going voltages, and wherein said
driver circuit is operative to drive said load with a first amplified output signal having a fixed slew rate defined in accordance with said positive-going voltage, and to drive said load with a second amplified output signal having a fixed slew rate defined in accordance with said negative-going voltage.

12. An amplifier according to claim 11, wherein said positive-going and negative-going voltage generators have complementary circuit configurations.

13. An amplifier according to claim 11, wherein said driver circuit includes first and second driver circuits, each of which is configured for closed loop operation.

14. An amplifier according to claim 11, wherein said driver circuit includes first and second driver circuits, each of which is configured for open loop operation.

15. An amplifier according to claim 11, wherein said driver circuit includes first and second driver circuits, one of which is configured for open loop operation and the other of which is configured for closed loop operation.

16. An amplifier for driving a load in accordance with an input signal that transitions between first and second input signal levels, comprising a voltage generator that controllably generates first and second opposite polarity changing voltages independent of said load, and an output driver, coupled to said voltage generator and being operative to drive said load with an output signal that transitions between first and second output levels at a slew rate based upon said first and second voltages, and wherein said output driver includes a voltage-controlled voltage source that generates said output signal as an output voltage in accordance with a respective changing voltage, and including a switching circuit which is operative to controllably switch said output signal to one of said first and second output levels, in response to said respective changing voltage reaching a threshold.

17. An amplifier for driving a load in accordance with an input signal that transitions between first and second input signal levels, comprising a voltage generator that controllably generates first and second opposite polarity changing voltages independent of said load, and an output driver, coupled to said voltage generator and being operative to drive said load with an output signal that transitions between first and second output levels at a slew rate based upon said first and second voltages, and wherein said output driver includes first and second driver circuits having respectively different circuit configurations.

18. An amplifier for driving a load in accordance with an input signal that transitions between first and second input signal levels, comprising a voltage generator that controllably generates first and second opposite polarity changing voltages independent of said load, and an output driver, coupled to said voltage generator and being operative to drive said load with an output signal that transitions between first and second output levels at a slew rate based upon said first and second voltages, and wherein said output driver is configured for open loop operation.

19. An amplifier for driving a load comprising:
a slew rate generator which is operative to generate a slew rate reference signal that is independent of said load; and
a driver circuit, which is operative to drive said load with an output signal in accordance with an input signal and having a slew rate based upon said slew rate reference signal, and wherein said slew rate generator includes a positive-going voltage generator which is operative to generate a positive-going voltage in response to a first polarity transition of said input signal, and a negative-going voltage generator which is operative to generate a negative-going voltage in response to a second polarity transition of said input signal, said driver circuit includes a first driver circuit, which is operative to drive said load with a first amplified output signal having a fixed slew rate defined in accordance with said positive-going voltage, and a second driver circuit, which is operative to drive said load with a second amplified output signal having a fixed slew rate defined in accordance with said negative-going voltage, and wherein said positive-going voltage generator and said first driver circuit are controllably disabled during a negative-going transition of said input signal, and wherein said negative-going voltage generator and said second driver circuit are controllably disabled during a positive-going transition of said input signal.

20. An amplifier for driving a load in accordance with an input signal that transitions between first and second input signal levels, comprising a voltage generator that controllably generates first and second opposite polarity changing voltages independent of said load, and an output driver, coupled to said voltage generator and being operative to drive said load with an output signal that transitions between first and second output levels at a slew rate based upon said first and second voltages; and further including
a bias circuit for supplying a bias current to said amplifier as said output driver circuit drives said load with said output signal that follows a respective changing voltage, and reducing power dissipation in said amplifier in response to said output signal transitioning from said respective changing voltage to one of said first and second output levels such that any current path through an active device of said amplifier in circuit with a power supply voltage for said amplifier will encounter that active device being in a high impedance state, resulting in minimal power dissipation in said amplifier.

21. An amplifier according to claim 20, wherein said voltage generator comprises a first voltage generator circuit, which is operative to generate a positive-going voltage in response to a first polarity transition of said input signal, and a second voltage generator circuit, which is operative to generate a negative-going voltage in response to a second polarity transition of said input signal.

22. An amplifier according to claim 20, wherein said output driver is operative to drive said output signal to a prescribed output level, in response to said output signal reaching a threshold.

23. An amplifier according to claim 20, wherein said load comprises a variable capacitance line.

24. An amplifier according to claim 20, wherein said output driver circuit is operative to drive said output signal to one of said first and second output levels in response to one of said respective changing voltage and said output signal reaching a threshold.

25. An amplifier according to claim 20, wherein said output driver is operative to drive said output signal to a prescribed output level, in response to said respective changing voltage reaching a threshold.

26. An amplifier according to claim 20, including an operational amplifier that generates said output signal as an output voltage that follows a changing voltage and supplies substantial current gain to said load, said operational amplifier having a first input that is coupled to receive said changing voltage, a second input that is coupled to monitor said output signal, and an output providing said output voltage that follows said changing voltage and supplies current to said load.

27. An amplifier according to claim 21, wherein said first and second voltage generator circuits have complementary circuit configurations.

28. An amplifier for driving a load comprising:
a slew rate generator which is operative to generate a slew rate reference signal that is independent of said load; and
a driver circuit, which is operative to drive said load with an output signal in accordance with an input signal and having a slew rate based upon said slew rate reference signal, and, wherein said driver circuit is configured for open loop operation.

29. An amplifier for driving a load comprising:
a slew rate generator which is operative to generate a slew rate reference signal that is independent of said load; and
a driver circuit, which is operative to drive said load with an output signal in accordance with an input signal and having a slew rate based upon said slew rate reference signal, and wherein said driver circuit is configured for closed loop operation.

30. An amplifier for driving a load in accordance with an input signal that transitions between first and second input signal levels, comprising a voltage generator that controllably generates first and second opposite polarity changing voltages independent of said load, and an output driver, coupled to said voltage generator and being operative to drive said load with an output signal that transitions between first and second output levels at a slew rate based upon said first and second voltages, and wherein said output driver includes a first driver circuit, which is operative to drive said load with a first amplified output signal having a slew rate defined in accordance with said positive-going voltage, and a second driver circuit, which is operative to drive said load with a second amplified output signal having a slew rate defined in accordance with said negative-going voltage, and wherein said first voltage generator and said first driver circuit are controllably disabled during a negative-going transition of said input signal, and wherein said second voltage generator and said second driver circuit are controllably disabled during a positive-going transition of said input signal.

31. An amplifier according to claim 22, wherein each of said first and second driver circuits is configured for closed loop operation.

32. An amplifier according to claim 22, wherein each of said first and second driver circuits is configured for open loop operation.

33. An amplifier according to claim 22, wherein one of said first and second driver circuits is configured for open loop operation and the other is configured for closed loop operation.

34. An amplifier according to claim 22, wherein said first voltage generator and said first driver circuit are controllably disabled during a negative-going transition of said input signal, and said second voltage generator and said second driver circuit are controllably disabled during a positive-going transition of said input signal.

35. A method for driving a load in accordance with an input signal having transitions between first and second input signal levels comprising the steps of:
(a) generating a changing voltage that is independent of said load; and
(b) driving said load with an output signal that transitions between first and second output levels at a slew rate based upon said changing voltage, and wherein
step (b) comprises driving said load with an output signal that tracks said changing voltage for a portion of a transition of said input signal and then switches to one of said first and second output levels.

36. A method according to claim 35, wherein step (a) comprises generating a positive-going voltage in response to a first polarity transition of said input signal, and generating a negative-going voltage in response to a second polarity transition of said input signal.

37. A method according to claim 35, wherein said load comprises a variable capacitance line.

38. A method according to claim 35, wherein step (b) comprises switching said output signal to one of said first and second output levels, in response to a changing voltage reaching a threshold.

39. A method according to claim 35, wherein step (b) comprises switching said output signal to one of said first and second output levels, in response to said output signal reaching a threshold.

40. A method according to claim 35, wherein step (b) comprises switching said output signal to said one of said first and second output levels, in response to one of said output signal and said changing voltage reaching a prescribed threshold.

41. An amplifier for driving a load comprising:
a slew rate generator which is operative to generate a slew rate reference signal that is independent of said load; and
a driver circuit, which is operative to drive said load with an output signal in accordance with an input signal and having a slew rate based upon said slew rate reference signal, and, wherein said driver circuit includes first and second driver circuits having respectively different circuit configurations.

* * * * *